(12) United States Patent
Jeong et al.

(10) Patent No.: US 10,777,141 B2
(45) Date of Patent: Sep. 15, 2020

(54) DISPLAY DEVICE

(71) Applicant: LG DISPLAY CO., LTD., Seoul (KR)

(72) Inventors: Ilgi Jeong, Cheongju-si (KR); Kyunghyun Cho, Jeongeup-si (KR)

(73) Assignee: LG DISPLAY CO., LTD., Seoul (KR)

( * ) Notice: Subject to any disclaimer, the term of this patent is extended or adjusted under 35 U.S.C. 154(b) by 136 days.

(21) Appl. No.: 15/824,821

(22) Filed: Nov. 28, 2017

(65) Prior Publication Data

US 2018/0151126 A1     May 31, 2018

(30) Foreign Application Priority Data

Nov. 30, 2016  (KR) ........................ 10-2016-0161513

(51) Int. Cl.
| | |
|---|---|
| *G09G 3/3266* | (2016.01) |
| *H01L 27/32* | (2006.01) |
| *H01L 27/12* | (2006.01) |
| *G02F 1/1343* | (2006.01) |
| *G09G 3/3275* | (2016.01) |

(Continued)

(52) U.S. Cl.
CPC ......... *G09G 3/3266* (2013.01); *G02F 1/1343* (2013.01); *G09G 3/3275* (2013.01); *H01L 27/124* (2013.01); *H01L 27/1248* (2013.01); *H01L 27/3258* (2013.01); *H01L 27/3276* (2013.01); *G02F 1/133707* (2013.01); *G02F 1/134309* (2013.01); *G02F 1/136286* (2013.01); *G02F 2201/52* (2013.01); *G09G 3/2003* (2013.01); *G09G 3/3233* (2013.01); *G09G 2300/0426* (2013.01);
(Continued)

(58) Field of Classification Search
CPC .............. G09G 3/3266; G09G 3/3275; G09G 2320/045; G09G 2320/0295; G09G 2300/0426; G09G 3/3233; G09G 3/2003; G09G 2340/06; G09G 2330/021; H01L 27/3276; H01L 27/1248; H01L 27/124; H01L 27/3258; G02F 1/1343; G02F 1/133707; G02F 1/134309; G02F 1/136286; G02F 2201/52
See application file for complete search history.

(56) References Cited

U.S. PATENT DOCUMENTS

| | | | | |
|---|---|---|---|---|
| 5,879,959 | A | * | 3/1999 | Chen ................. G02F 1/136209 257/59 |
| 6,268,895 | B1 | * | 7/2001 | Shimada ........... G02F 1/133512 349/110 |

(Continued)

FOREIGN PATENT DOCUMENTS

| | | |
|---|---|---|
| CN | 101887691 A | 11/2010 |
| CN | 103713792 A | 4/2014 |

(Continued)

*Primary Examiner* — Grant Sitta
(74) *Attorney, Agent, or Firm* — Seed IP Law Group LLP

(57) ABSTRACT

A display device including subpixels and at least two scan lines is disclosed. The subpixels are arranged on a substrate, and each subpixel includes an emission area, in which an emission element is disposed to emit light, and a circuit area, in which a circuit for driving the emission element is disposed. The at least two scan lines are positioned in the circuit area. One or more of the at least two scan lines are formed by a metal layer different from a gate metal layer constituting gate electrodes of transistors disposed in the circuit area.

22 Claims, 10 Drawing Sheets

(51) Int. Cl.
*G09G 3/3233* (2016.01)
*G02F 1/1337* (2006.01)
*G02F 1/1362* (2006.01)
*G09G 3/20* (2006.01)

(52) U.S. Cl.
CPC ............ *G09G 2320/0295* (2013.01); *G09G 2320/045* (2013.01); *G09G 2330/021* (2013.01); *G09G 2340/06* (2013.01)

(56) References Cited

U.S. PATENT DOCUMENTS

| | | | | |
|---|---|---|---|---|
| 6,404,466 | B1* | 6/2002 | Miyahara | G02F 1/13624 349/48 |
| 7,535,521 | B2* | 5/2009 | Kim | G02F 1/136204 349/139 |
| 8,334,940 | B2* | 12/2012 | Tseng | G02F 1/133512 349/110 |
| 2001/0046003 | A1* | 11/2001 | Song | G02F 1/136209 349/43 |
| 2006/0017865 | A1* | 1/2006 | Tsubata | G02F 1/133707 349/106 |
| 2007/0152180 | A1* | 7/2007 | Tseng | G09G 3/3233 250/591 |
| 2008/0067570 | A1 | 3/2008 | Yamashita et al. | |
| 2010/0065849 | A1* | 3/2010 | Lee | H01L 51/5284 257/72 |
| 2011/0147757 | A1* | 6/2011 | Kim | H01L 29/78633 257/71 |
| 2012/0080681 | A1* | 4/2012 | Kim | H01L 29/458 257/59 |
| 2012/0105784 | A1* | 5/2012 | Ho | G02F 1/136286 349/139 |
| 2013/0119388 | A1* | 5/2013 | Lee | H01L 27/3265 257/59 |
| 2013/0300533 | A1* | 11/2013 | Bisplinghoff | H01C 1/1406 338/22 R |
| 2015/0102323 | A1 | 4/2015 | Koshihara et al. | |
| 2015/0123107 | A1* | 5/2015 | Choi | H01L 27/3272 257/40 |
| 2015/0187860 | A1* | 7/2015 | Seo | H01L 27/3276 257/40 |
| 2016/0141349 | A1* | 5/2016 | Yun | H01L 27/3272 257/40 |
| 2016/0300533 | A1* | 10/2016 | Lee | G09G 3/3266 |
| 2016/0342034 | A1* | 11/2016 | Wu | G02F 1/1368 |
| 2017/0255068 | A1* | 9/2017 | Wu | G02F 1/136286 |

FOREIGN PATENT DOCUMENTS

| | | |
|---|---|---|
| CN | 104035250 A | 9/2014 |
| CN | 105225632 A | 1/2016 |
| CN | 105609528 A | 5/2016 |
| EP | 2 950 299 A1 | 12/2015 |
| KR | 10-2008-0109453 A | 12/2008 |

* cited by examiner

DISPLAY DEVICE

CROSS-REFERENCE TO RELATED APPLICATION(S)

This application claims the benefit of Korean Patent Application No. 10-2016-0161513, filed on Nov. 30, 2016, which is incorporated herein by reference for all purposes as if fully set forth herein.

BACKGROUND

Technical Field

The present disclosure relates to a display device, and more particularly, to a display device having at least two scan lines positioned in a circuit area of a subpixel.

Description of the Related Art

With the development of information technology, the market of display devices used as a connection medium between a user and information is growing. Thus, the use of display devices, such as an organic light emitting diode (OLED) display, a liquid crystal display (LCD), and a plasma display panel (PDP), is on the rise.

An OLED display includes a display panel including a plurality of subpixels and a driver for driving the display panel. The driver includes a scan driver for supplying a scan signal (or a gate signal) to the display panel, a data driver for supplying a data signal to the display panel, and the like.

When the scan signal and the data signal are supplied to the subpixels arranged in a matrix, the subpixels selected in response to the scan signal and the data signal emit light. Hence, the OLED display can display an image.

When the OLED display is used for a long time, the OLED display has a problem in that some of the components included in the subpixels may experience a change in characteristics (for example, threshold voltage, current mobility, etc.). In order to compensate for the change in the characteristics, a method according to a related art has been proposed to add a sensing circuit for sensing characteristics of components included in subpixels.

When the sensing circuit is added inside the subpixel as described above, it is necessary to consider various problems including a reduction in an aperture ratio of the subpixel, a problem that lines such as signal lines or power lines and electrodes are damaged by a laser in a repair process, etc. Such problems may be of particular significance when high resolution and large-sized display devices are used.

BRIEF SUMMARY

A display device according to an embodiment includes: subpixels arranged on a substrate, each subpixel including an emission area, in which an emission element is disposed to emit light, and a circuit area, in which a circuit for driving the emission element is disposed; and at least two scan lines positioned in the circuit area, wherein one or more of the at least two scan lines are formed by a metal layer different from a gate metal layer constituting gate electrodes of transistors disposed in the circuit area.

A display device according to another embodiment includes: pixels arranged on a substrate, each pixel including an emission area, in which an emission element is disposed to emit light, and a circuit area, in which a circuit for driving the emission element is disposed; and at least two scan lines positioned in the circuit area, wherein the at least two scan lines include a first scan line and a second scan line positioned in opposite portions on the circuit area and are spaced apart from each other.

BRIEF DESCRIPTION OF THE SEVERAL VIEWS OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
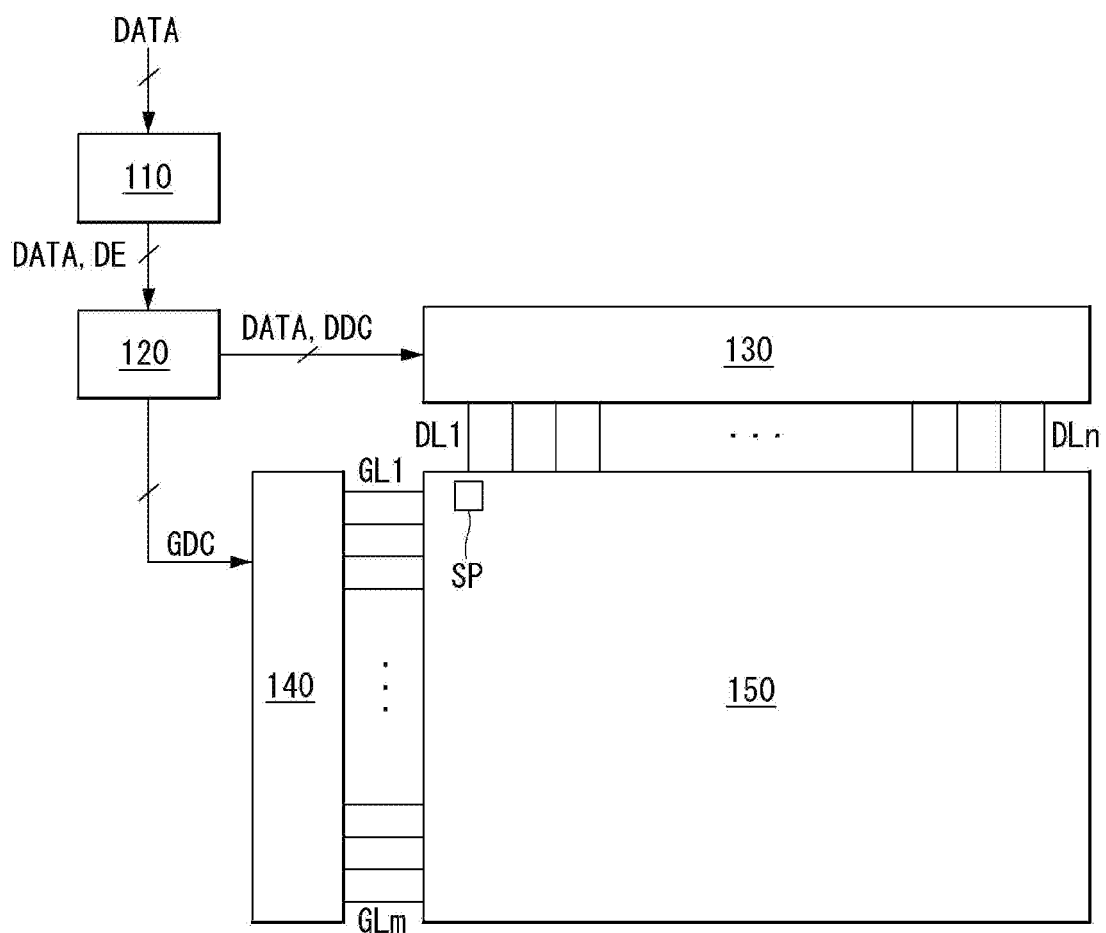
FIG. 1 is a schematic block diagram of an organic light emitting diode (OLED) display.

Reference will now be made in detail to embodiments of the present disclosure, examples of which are illustrated in the accompanying drawings. Wherever convenient for explanation of the embodiments provided herein, the same reference numbers will be used throughout the drawings to refer to the same or like parts. In the present disclosure, a detailed description of known components or functionalities may be omitted if it is determined that a detailed description of such known components or functionalities may mislead or otherwise obscure the description of the embodiments of the present disclosure.

A display device according to embodiments may be implemented as a television system, a video player, a personal computer (PC), a home theater system, a smart phone, and the like. In the following description, a display device according to embodiments may be an organic light emitting diode (OLED) display implemented based on organic light emitting diodes (or light emitting elements), as an example. The OLED display according to embodiments performs an image display operation for displaying an image and an external compensation operation for compensating for changes in characteristics (or time-varying characteristics) of components over time.

The external compensation operation may be performed in a vertical blanking interval during the image display operation, in a power-on sequence interval before the beginning of the image display operation, or in a power-off sequence interval after the end of the image display operation. The vertical blanking interval is a period of time during which a data signal for image display is not applied, and is arranged between vertical active periods in which the data signal for one frame is applied.

The power-on sequence interval is a period of time between the turn-on of electric power for driving a display device and the beginning of an image display period, during which images are displayed on the display device. The power-off sequence interval is a period of time between the end of an image display period and the turn-off of electric power for driving the device.

An external compensation method performing the external compensation operation may operate a driving transistor in a source follower manner and then sense a voltage (for example, a source voltage of the driving transistor) stored in a line capacitor of a sensing line, but is not limited thereto. The line capacitor means a specific capacitance existing on the sensing line.

In order to compensate for a variation in a threshold voltage of the driving transistor, the external compensation method senses a source voltage when a voltage of a source node of the driving transistor is saturated (i.e., when a current Ids of the driving transistor is zero). Further, in order to compensate for a variation in mobility of the driving transistor, the external compensation method senses the voltage of the source node in a linear state before the voltage of the source node of the driving transistor is saturated.

In the following description, electrodes of a thin film transistor except a gate electrode may be referred to as a source electrode and a drain electrode, or a drain electrode and a source electrode, depending on types of thin film transistors. In addition, in the following description, a source electrode and a drain electrode, or a drain electrode and a source electrode, of the thin film transistor may be referred to as a first electrode and a second electrode.

Figure 2:
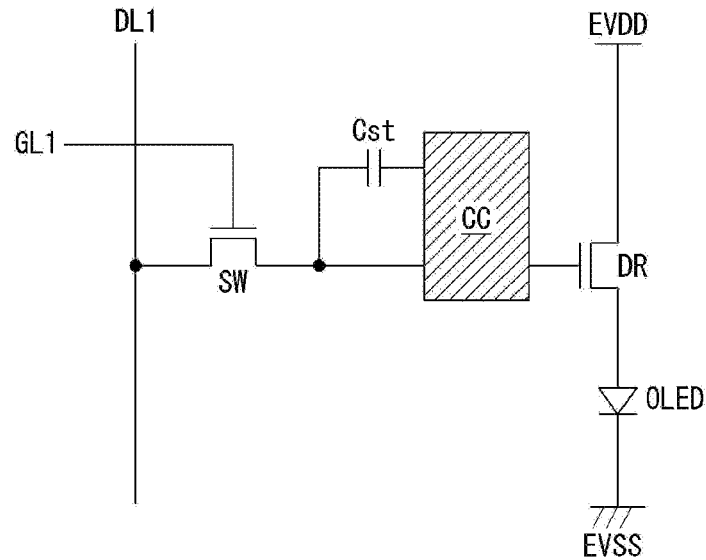
FIG. 2 schematically illustrates a circuit configuration of a subpixel.
Figure 3:
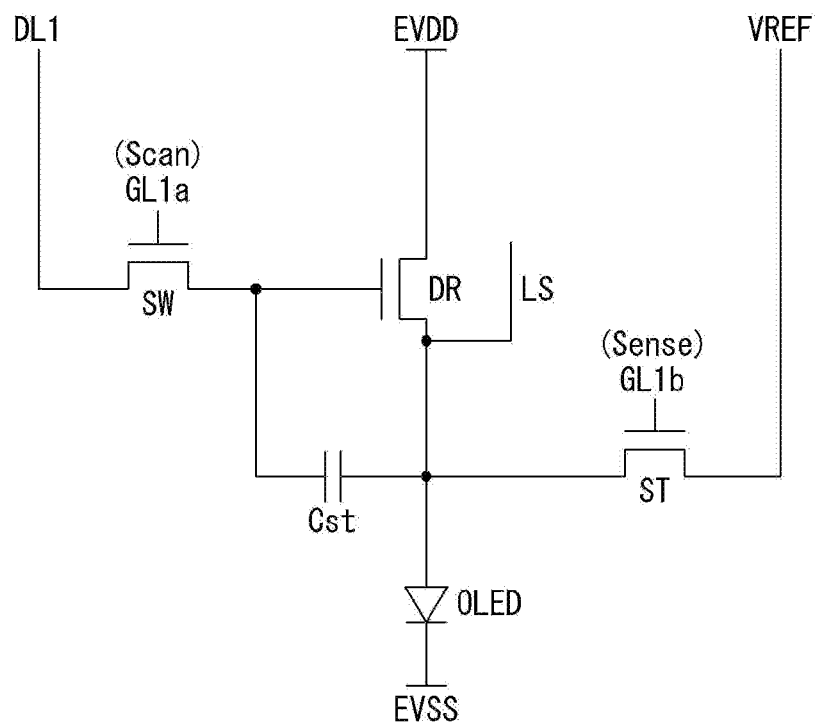
FIG. 3 illustrates in detail a circuit configuration of a subpixel.
Figure 4:
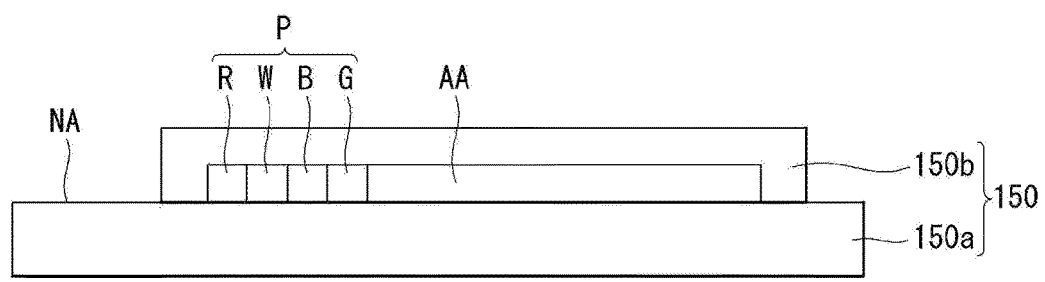
FIG. 4 is an exemplary cross-sectional view of a display panel.

FIG. 1 is a schematic block diagram of an OLED display. FIG. 2 schematically illustrates a circuit configuration of a subpixel. FIG. 3 illustrates in detail a circuit configuration of a subpixel. FIG. 4 is an exemplary cross-sectional view of a display panel.

As shown in FIG. 1, an OLED display according to an embodiment includes an image processing unit 110, a timing controller 120, a data driver 130, a scan driver 140, and a display panel 150.

The image processing unit 110 outputs a data signal DATA and a data enable signal DE supplied from outside of the display device. The image processing unit 110 may further output one or more of a vertical sync signal, a horizontal sync signal, and a clock signal in addition to the data signal DATA and data enable signal DE. For the sake of brevity and ease of reading, these signals are not shown.

The timing controller 120 receives the data signal DATA and the data enable signal DE, and may further receive driving signals including the vertical sync signal, the horizontal sync signal, the clock signal, etc., from the image processing unit 110. The timing controller 120 outputs a gate timing control signal GDC for controlling operation timing of the scan driver 140 and a data timing control signal DDC for controlling operation timing of the data driver 130 based on the driving signals.

The data driver 130 samples and latches the data signal DATA received from the timing controller 120 in response to the data timing control signal DDC supplied from the timing controller 120 and converts the sampled and latched data signal DATA using gamma reference voltages. The data driver 130 outputs the converted data signal DATA to data lines DL1 to DLn. The data driver 130 may be formed as an integrated circuit (IC).

The scan driver 140 outputs a scan signal in response to the gate timing control signal GDC supplied from the timing controller 120. The scan driver 140 outputs the scan signal to scan lines GL1 to GLm. The scan driver 140 is formed as an IC or is formed on the display panel 150 in a gate-in-panel (GIP) manner.

The display panel 150 displays an image in response to the data signal DATA and the scan signal respectively received from the data driver 130 and the scan driver 140. The display panel 150 includes subpixels SP configured to display an image.

The subpixels SP may include red, green, and blue subpixels, or may include white, red, green, and blue subpixels. The subpixels SP may have one or more different emission areas depending on emission characteristics.

As shown in FIG. 2, each subpixel may include a switching transistor SW, a driving transistor DR, a capacitor Cst, a compensation circuit CC, and an organic light emitting diode OLED.

The switching transistor SW performs a switching operation so that a data signal supplied through a first data line DL1 is stored in the capacitor Cst as a data voltage in response to a scan signal supplied through a first scan line GL1. The driving transistor DR enables a driving current to flow between a first power line (which may be referred to herein as a "high potential power line") EVDD and a second power line (which may be referred to herein as a "low potential power line") EVSS based on the data voltage stored in the capacitor Cst. The organic light emitting diode OLED emits light depending on the driving current provided by the driving transistor DR.

The compensation circuit CC is a circuit that is added to the subpixel and compensates for a characteristic, such as a threshold voltage, etc., of the driving transistor DR. The compensation circuit CC includes one or more transistors. Configuration of the compensation circuit CC may be variously changed in accordance with various embodiments, depending on an external compensation method and is described below with reference to FIG. 3.

As shown in FIG. 3, the compensation circuit CC may include a sensing transistor ST and a sensing line (which may be referred to herein as a "reference line") VREF. The sensing transistor ST is connected between the sensing line VREF and a node (hereinafter referred to as "sensing node") that is electrically coupled to a source electrode of the driving transistor DR and to an anode electrode of the organic light emitting diode OLED. The sensing transistor ST may supply an initialization voltage (which may be referred to herein as a "sensing voltage") transmitted through the sensing line VREF to the sensing node of the driving transistor DR, or may sense a voltage or a current of the sensing node of the driving transistor DR or a voltage or a current of the sensing line VREF.

A first electrode of the switching transistor SW is connected to the first data line DL1, and a second electrode of the switching transistor SW is connected to a gate electrode of the driving transistor DR. A first electrode of the driving transistor DR is connected to the first power line EVDD, and a second electrode of the driving transistor DR is connected to the anode electrode of the organic light emitting diode OLED. A first electrode of the capacitor Cst is connected to the gate electrode of the driving transistor DR, and a second electrode of the capacitor Cst is connected to the anode electrode of the organic light emitting diode OLED. The anode electrode of the organic light emitting diode OLED is connected to the second electrode of the driving transistor DR, and a cathode electrode of the organic light emitting diode OLED is connected to the second power line EVSS. A first electrode of the sensing transistor ST is connected to the sensing line VREF, and a second electrode of the sensing transistor ST is connected to the sensing node, i.e., the anode electrode of the organic light emitting diode OLED and the second electrode of the driving transistor DR.

An operation time of the sensing transistor ST may be similar to (or the same as) or different from an operation time of the switching transistor SW depending on an external compensation algorithm (or depending on a configuration of the compensation circuit). For example, a gate electrode of the switching transistor SW may be connected to a 1a scan line GL1a, and a gate electrode of the sensing transistor ST may be connected to a 1b scan line GL1b. In this instance, a scan signal (Scan) may be transmitted to the 1a scan line GL1a, and a sensing signal (Sense) may be transmitted to the 1b scan line GL1b. As another example, the gate electrode of the switching transistor SW and the gate electrode of the sensing transistor ST may share the 1a scan line GL1a or the 1b scan line GL1b and thus the gate electrodes of the switching transistor SW and the sensing transistor ST may be connected.

*The sensing line VREF may be connected to the data driver, e.g., the data driver 130 shown in FIG. 1**. In this instance, the data driver may sense the sensing node of the subpixel, via the sensing line VREF, during a non-display period of a real-time image or N frame period and generate a result of the sensing, where N is an integer equal to or greater than 1. The switching transistor SW and the sensing transistor ST may be turned on at the same time. In such a case, a sensing operation using the sensing line VREF and a data output operation, for driving the organic light-emitting diode OLED based on the data signal output by the data driver, are separated (or distinguished) from each other in accordance with a time-division driving method of the data driver.

In addition, a compensation target according to the sensing result may be a digital data signal, an analog data signal, a gamma signal, or the like. The compensation circuit for generating a compensation signal (or a compensation voltage) based on the sensing result may be implemented inside the data driver, inside the timing controller, or as a separate circuit.

A light shielding layer LS may be disposed only below a channel region of the driving transistor DR. Alternatively, the light shielding layer LS may be disposed below the channel region of the driving transistor DR and below channel regions of the switching transistor SW and the sensing transistor ST. The light shielding layer LS may be simply used for shielding external light. In addition, the light shielding layer LS may be connected to another electrode or another line and used as an electrode constituting the capacitor, etc. Therefore, the light shielding layer LS may be provided as a multilayer element formed of metal (for example, a multilayer of two different metals), so as to have a light shielding characteristic.

FIG. 3 illustrates the subpixel having a 3T(Transistor)1C (Capacitor) configuration, including the switching transistor SW, the driving transistor DR, the capacitor Cst, the organic light emitting diode OLED, and the sensing transistor ST, by way of example. However, when the compensation circuit CC is added to the subpixel, the subpixel may have various configurations such as 3T2C, 4T2C, 5T1C, and 6T2C.

As shown in FIG. 4, subpixels are formed on a display area AA of a first substrate (which may be referred to herein as a "thin film transistor substrate") 150a, and each subpixel may have the circuit structure illustrated in FIG. 3. The subpixels on the display area AA are sealed by a protective film (which may be referred to herein as a "protective substrate") 150b. In FIG. 4, the reference "NA" denotes a non-display area of the display panel. The first substrate 150a may be formed of a rigid or semi-rigid material such as glass, or it may be formed of a flexible material.

The subpixels are arranged on a surface of the first substrate 150a, and may be horizontally or vertically arranged in order of red (R), white (W), blue (B), and green (G) subpixels on the display area AA, depending on an orientation of the first substrate 150a. The red (R), white (W), blue (B), and green (G) subpixels together form one pixel P. However, embodiments are not limited thereto. For example, the arrangement order of the subpixels may be variously changed depending on an emission material, an emission area, configuration (or structure) of the compensation circuit, and the like. Further, the red (R), blue (B), and green (G) subpixels may form one pixel P.

A method of manufacturing the display panel 150 may include deposition processes for depositing a conductive layer, a metal layer, an insulating layer, etc. on a substrate to form a structure including a variety of elements (including electrodes), power lines, signal lines, etc., and may further include a repair process for repairing one or more defects of the structure on the substrate or for turning off a defective subpixel.

Because the method of manufacturing the display panel is complicated, as described above, an aperture ratio of the subpixel may be reduced when a sensing circuit for sensing characteristics of the components included in the subpixel is added, as adding such a circuit results in increasing a circuit area of the subpixel. Further, the power lines, the signal lines, and the electrodes may be damaged by a laser in the repair process.

Hereinafter, a problem of an experimental example is discussed, and embodiments of the present disclosure that overcome the problem are described. In the following description, embodiments are described using two scan lines as an example, but are not limited thereto.

Experimental Example

Figure 5:
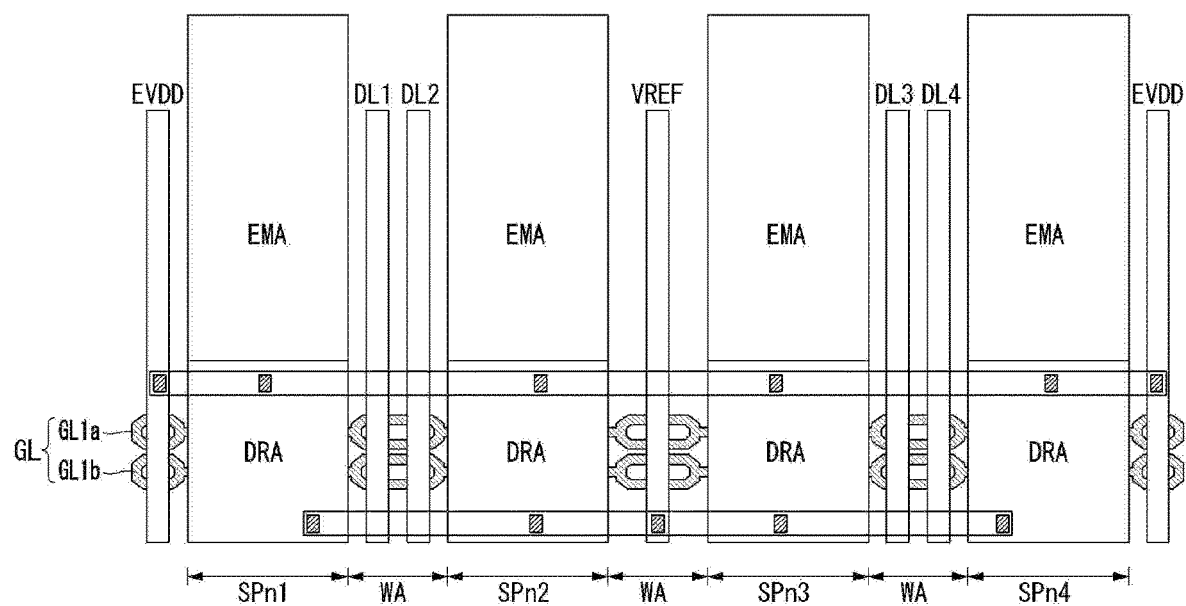
FIG. 5 schematically illustrates a planar layout of subpixels according to an experimental example.
Figure 6:
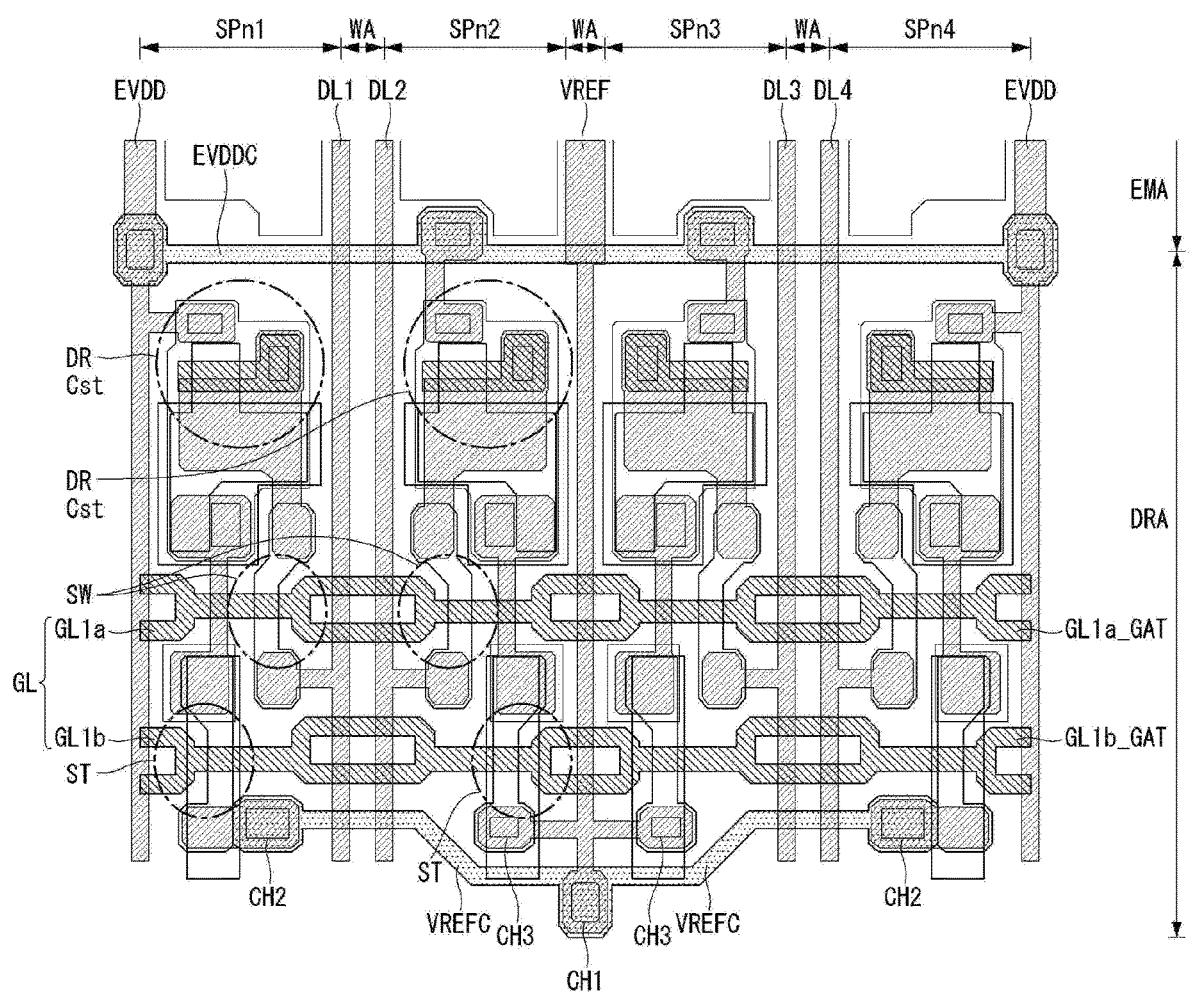
FIG. 6 illustrates in detail a circuit area of FIG. 5 according to the experimental example.
Figure 7:
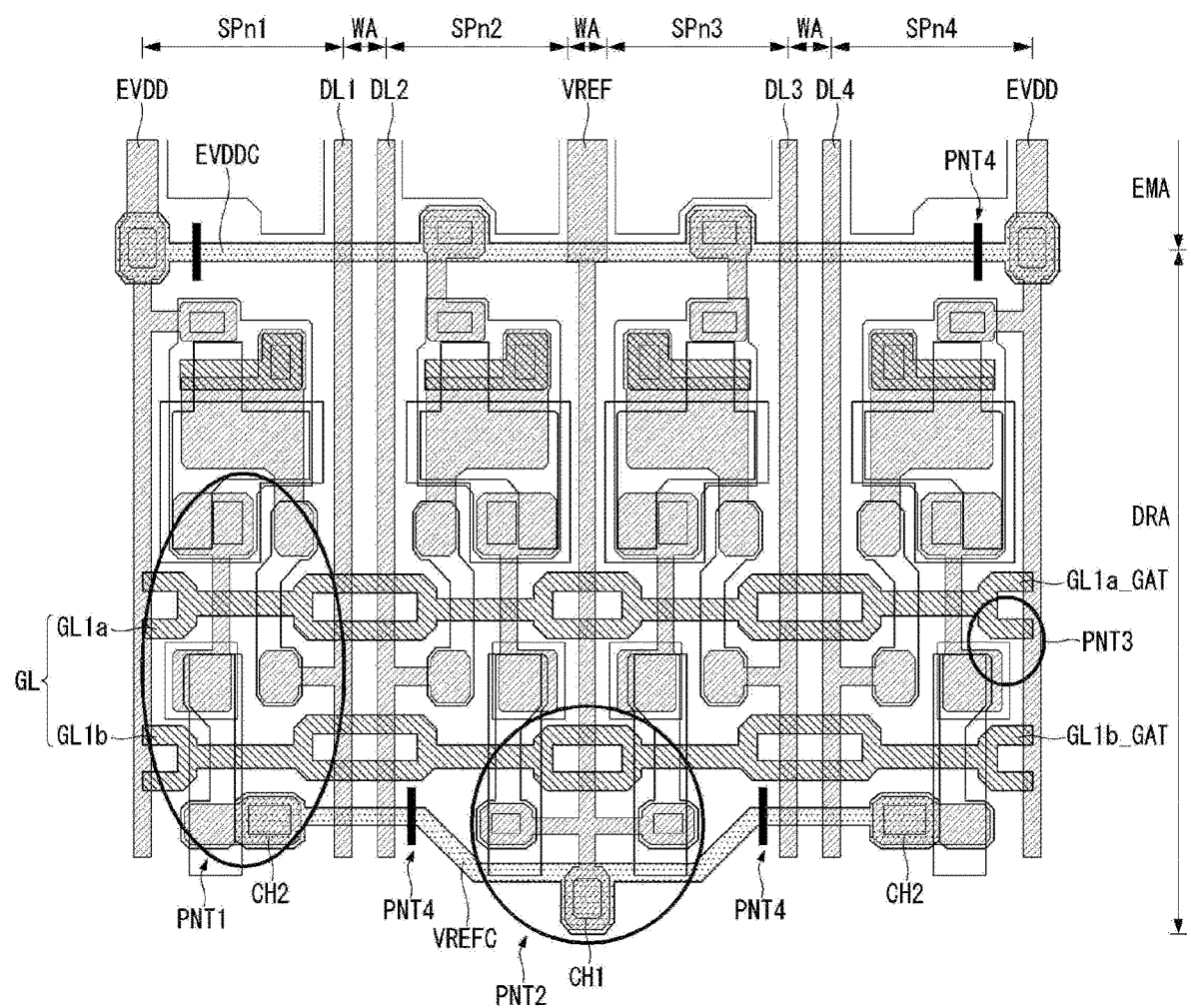
FIG. 7 is a diagram for explaining a problem of the experimental example of FIGS. 5 and 6.

FIG. 5 schematically illustrates a planar layout of subpixels according to an experimental example. FIG. 6 illustrates in detail a circuit area of the experimental example of FIG. 5. FIG. 7 is a diagram for explaining a problem of the experimental example.

With reference to FIGS. 4 and 5, first to fourth subpixels SPn1 to SPn4 each having an emission area EMA and a circuit area DRA are formed on a display area AA of a first substrate 150a. An organic light emitting diode (or a light emitting element) is formed in the emission area EMA, and a circuit including a switching transistor SW, a sensing transistor ST, a driving transistor DR, etc., for driving the organic light emitting diode OLED is formed in the circuit area DRA. The elements in the emission area EMA and the circuit area DRA are formed through a thin film deposition process and include a plurality of metal layers and a plurality of insulating layers.

In the first to fourth subpixels SPn1 to SPn4, the organic light emitting diode in the emission area EMA emits light in response to an operation of the switching transistor SW and the driving transistor DR in the circuit area DRA. A line area WA is between each adjacent two of the first to fourth subpixels SPn1 to SPn4. A first power line EVDD, a sensing line VREF, and first to fourth data lines DL1 to DL4 are disposed in the line area WA.

The lines such as the first power line EVDD, the sensing line VREF, and the first to fourth data lines DL1 to DL4, and electrodes constituting a thin film transistor are positioned on different layers, but are electrically connected to each other through contact holes (or via holes). The contact holes are formed through a dry or wet etching process to partially expose the electrode, the signal line, or the power line positioned on a lower part of the subpixel.

As shown in FIG. 6, a driving transistor DR and a capacitor Cst are disposed in an upper portion of the circuit area DRA. The upper portion of the circuit area DRA is a portion adjacent to a first power connection line EVDDC, which is connected to the first power line EVDD. The first power line EVDD is disposed in a first direction (for example, a vertical direction), and the first power connection line EVDCC is disposed in a second direction (for example, a horizontal direction) that is transverse to the first direction. A 1b scan line GL1b and a sensing transistor ST are disposed in a lower portion of the circuit area DRA. The lower portion of the circuit area DRA is a portion adjacent to a sensing connection line VREFC, which is connected to the sensing line VREF. The sensing line VREF is disposed in the first direction, and the sensing connection line VREFC is disposed in the second direction. A 1a scan line GL1a and a switching transistor SW are disposed in a middle portion of the circuit area DRA, which is between the upper portion and the lower portion. The middle portion of the circuit area DRA is a portion adjacent to the 1a scan line GL1a disposed in the second direction.

As shown in FIG. 7, in the experimental example, the 1a scan line GL1a and the 1b scan line GL1b are formed using gate metal layers and are disposed close to each other between the middle portion and the lower portion of the circuit area DRA. As a result, electrodes adjacent to the 1a scan line GL1a and the 1b scan line GL1b have to be connected with an insulating layer interposed therebetween. Thus, as indicated by "PNT1" of FIG. 7, many jumping electrodes are required in the experimental example.

In the experimental example, as indicated by "PNT2" of FIG. 7, because a space restriction is caused due to the adjacent arrangement of three or more kinds of signal lines and the electrodes, an aperture ratio of the subpixel is reduced. That is, additional space is required to accommodate the adjacent arrangement of the signal lines and electrodes, and thus a size of the circuit area DRA is increased with respect to a size of the emission area EMA. In addition, portions of the 1a scan line GL1a and the 1b scan line GL1b that overlap (or intersect) the first power line EVDD and the first to fourth data lines DL1 to DL4 are branched to form branch portions, so as to solve a structural problem (including a line load problem, a damage problem in the repair process, etc.) of the 1a scan line GL1a and the 1b scan line GL1b. As a result, as indicated by "PNT2" of FIG. 7, a position of a contact hole CH, in which the sensing line VREF and the sensing connection line VREFC contact each other, has to be pulled even lower in the lower portion of the circuit area DRA, and the sensing connection line VREFC has to be disposed in a nonlinear form. However, this leads to a further reduction in the aperture ratio of the subpixel.

Further, in the experimental example, as indicated by "PNT3" of FIG. 7, the 1a scan line GL1a and the 1b scan line GL1b overlap the electrodes adjacent to the 1a scan line GL1a and the 1b scan line GL1b with the insulating layer interposed therebetween, and a parasitic capacitor is generated in a plurality of overlap areas between the 1a scan line GL1a and the 1b scan line GL1b and the electrodes. Hence, a line load increases.

In the experimental example, as indicated by "PNT4" of FIG. 7, it is difficult to secure a repair margin due to a space restriction, in which a repair design has to be performed only in the vertical direction. Further, this leads to a reduction in the aperture ratio of the subpixel.

The reason why the problems described in the experimental example are generated is because the 1a scan line GL1a and the 1b scan line GL1b are formed using the gate metal layers constituting the gate electrodes of the switching transistor SW and the sensing transistor ST in accordance with a conventional method. Hence, the problems of the experimental example are generated by an increase in a size of a portion related to another metal layer (for example, a source/drain metal layer) positioned on or below the gate metal layer due to its structural characteristics.

In order to further consider the above-described problems of the experimental example including a reduction in the aperture ratio of the subpixel, the repair process problem, an increase in the line load, and the like, the position and the structure of the 1a scan line GL1a, the 1b scan line GL1b, and the switching transistors SW and the sensing transistor ST connected to the 1a scan line GL1a and the 1b scan line GL1b have to be changed.

First Embodiment

Figure 8:
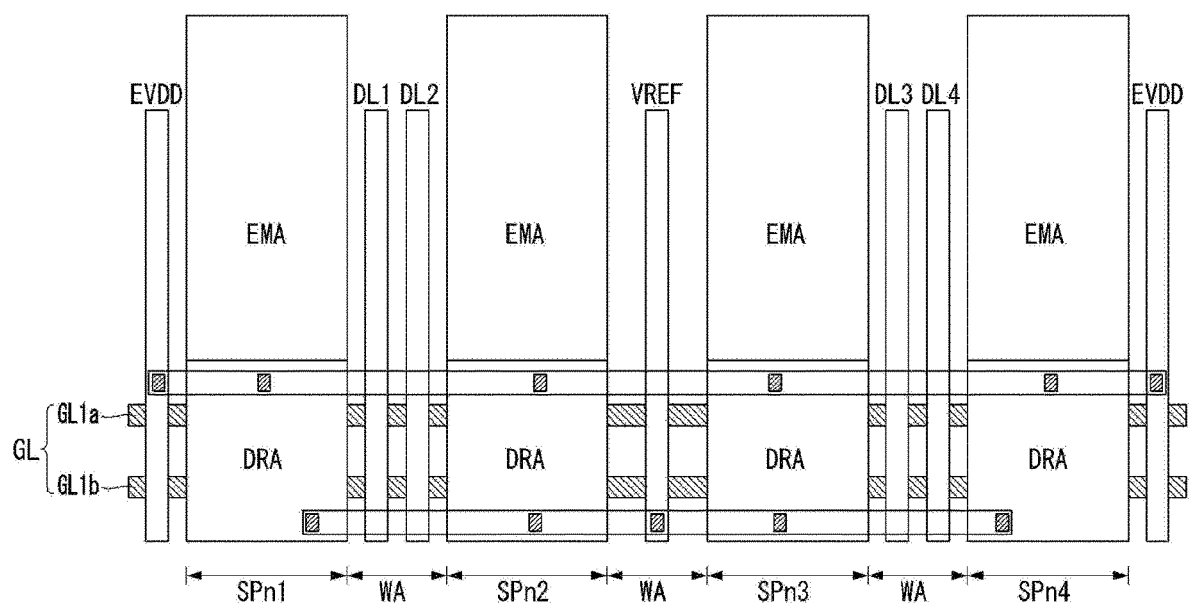
FIG. 8 schematically illustrates a planar layout of subpixels according to a first embodiment.
Figure 9:
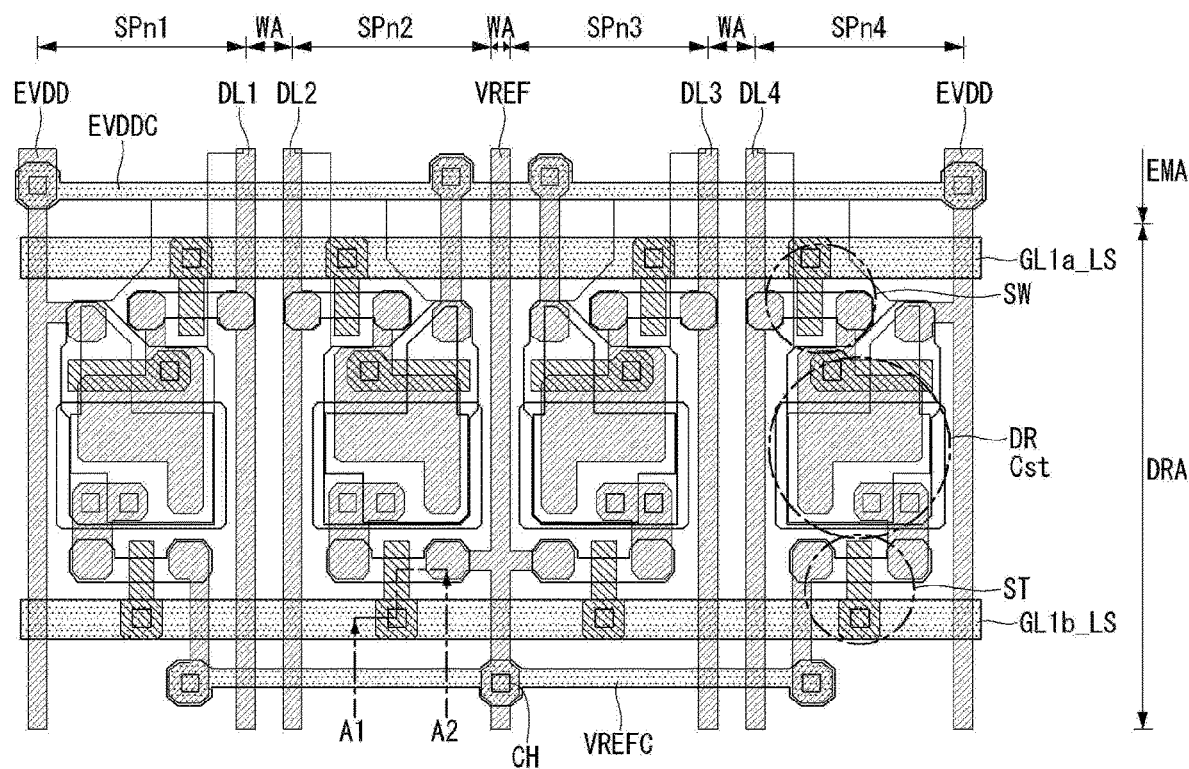
FIG. 9 illustrates in detail a circuit area of FIG. 8 in accordance with the first embodiment.
Figure 10:
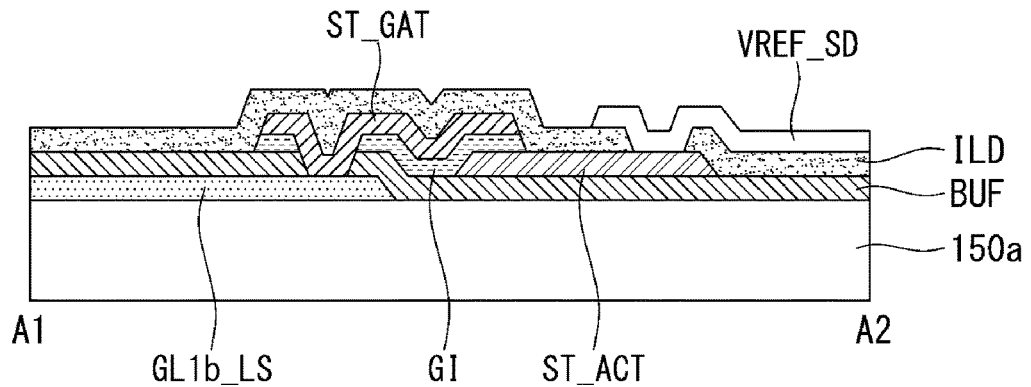
FIG. 10 is a cross-sectional view of a portion A1-A2 of FIG. 9.
Figure 11:
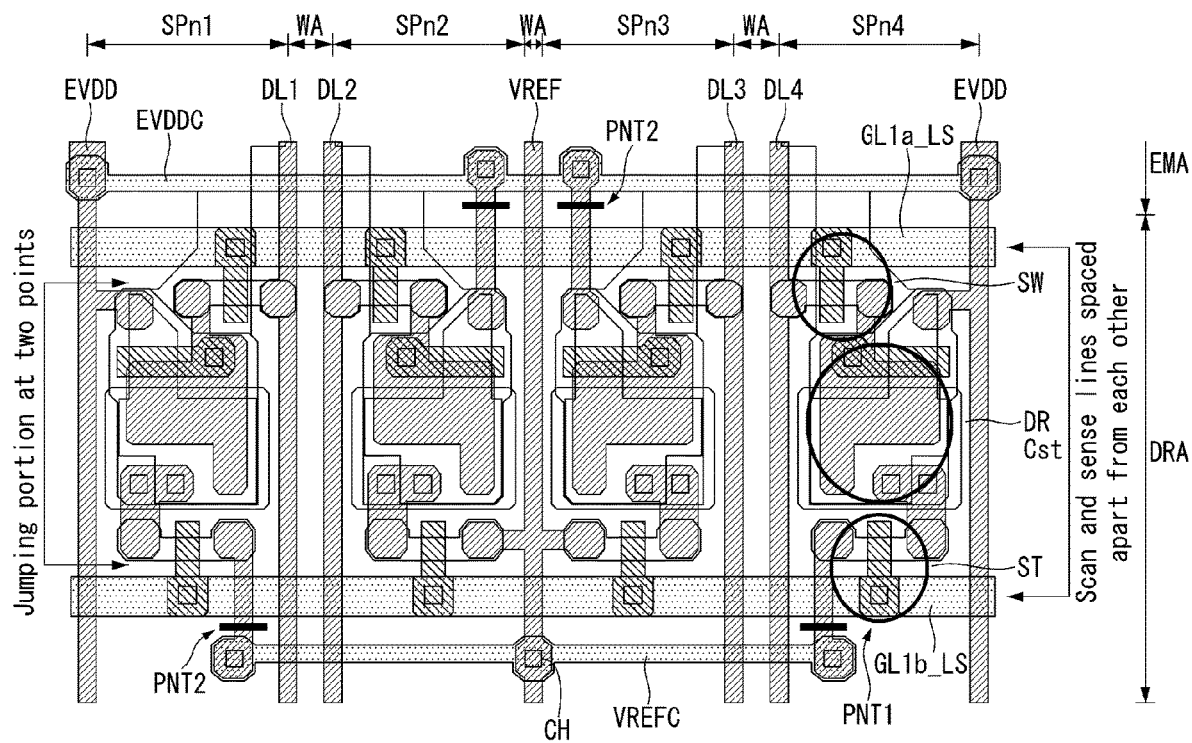
FIG. 11 is a diagram for explaining an improvement of the first embodiment.

FIG. 8 schematically illustrates a planar layout of subpixels according to a first embodiment. FIG. 9 illustrates in detail a circuit area of FIG. 8 in accordance with the first embodiment. FIG. 10 is a cross-sectional view of a portion A1-A2 of FIG. 9. FIG. 11 is a diagram for explaining an improvement of the first embodiment.

As shown in FIGS. 4 and 8, first to fourth subpixels SPn1 to SPn4 each having an emission area EMA and a circuit area DRA are formed on a display area AA of a first substrate 150a. An organic light emitting diode (or a light emitting element) is formed in the emission area EMA, and a circuit including a switching transistor SW, a sensing transistor ST, a driving transistor DR, etc., for driving the organic light emitting diode OLED is formed in the circuit area DRA. The elements in the emission area EMA and the circuit area DRA are formed through a thin film deposition process including a plurality of metal layers and a plurality of insulating layers.

In the first to fourth subpixels SPn1 to SPn4, the organic light emitting diode in the emission area EMA emits light in response to an operation of the switching transistor SW and the driving transistor DR in the circuit area DRA. A line area WA is positioned between adjacent two of the first to fourth subpixels SPn1 to SPn4. A first power line EVDD, a sensing line VREF, and first to fourth data lines DL1 to DL4 are disposed in the line area WA.

For example, the first power line EVDD may be positioned on the left side of the first subpixel SPn1, the sensing line VREF may be positioned on the right side of the second subpixel SPn2, and the first and second data lines DL1 and DL2 may be positioned between the first subpixel SPn1 and the second subpixel SPn2. The sensing line VREF may be positioned on the left side of the third subpixel SPn3, the first power line EVDD may further be positioned on the right side of the fourth subpixel SPn4, and the third and fourth data lines DL3 and DL4 may be positioned between the third subpixel SPn3 and the fourth subpixel SPn4.

The first subpixel SPn1 may be electrically connected to the first power line EVDD on the left side of the first subpixel SPn1, the first data line DL1 on the right side of the first subpixel SPn1, and the sensing line VREF on the right side of the second subpixel SPn2. The second subpixel SPn2 may be electrically connected to the first power line EVDD on the left side of the first subpixel SPn1, the second data line DL2 on the left side of the second subpixel SPn2, and the sensing line VREF on the right side of the second subpixel SPn2.

The third subpixel SPn3 may be electrically connected to the sensing line VREF on the left side of the third subpixel SPn3, the third data line DL3 on the right side of third subpixel SPn3, and the first power line EVDD on the right side of the fourth subpixel SPn4. The fourth subpixel SPn4 may be electrically connected to the sensing line VREF on the left side of the third subpixel SPn3, the fourth data line DL4 on the left side of the fourth subpixel SPn4, and the first power line EVDD on the right side of the fourth subpixel SPn4.

The first to fourth subpixels SPn1 to SPn4 may be commonly connected to the sensing line VREF between the second subpixel SPn2 and the third subpixel SPn3. Namely, the first to fourth subpixels SPn1 to SPn4 may share the sensing line VREF with one another. However, embodiments are not limited thereto.

The lines such as the first power line EVDD and the sensing line VREF and electrodes constituting a thin film transistor are positioned on different layers, but are electrically connected to each other through contact holes (or via holes). The contact holes are formed through a dry or wet etching process to partially expose the electrode, the signal line, or the power line positioned on a lower part of the subpixel.

As shown in FIG. 9, a 1a scan line GL1a and a switching transistor SW are disposed in an upper portion of the circuit area DRA. The upper portion of the circuit area DRA is a portion adjacent to a first power connection line EVDDC that is connected to the first power line EVDD. The first power line EVDD is disposed in a first direction (for example, a vertical direction), and the first power connection line EVDDC is disposed in a second direction (for example, a horizontal direction). A 1b scan line GL1b and a sensing transistor ST are disposed in a lower portion of the circuit area DRA. The lower portion of the circuit area DRA is a portion adjacent to a sensing connection line VREFC that is connected to the sensing line VREF. The sensing line VREF is disposed in the first direction, and the sensing connection line VREFC is disposed in the second direction. A driving transistor DR and a capacitor Cst are disposed in a middle portion of the circuit area DRA. The middle portion of the circuit area DRA is a portion between the upper and lower portions, e.g., between the switching transistor SW and the sensing transistor ST.

Each of the 1a scan line GL1a and the 1b scan line GL1b is formed using a metal layer (for example, a light shielding layer) existing in a lowermost layer on the first substrate 150a. A structure of the 1b scan line GL1b is described below with reference to FIG. 10. Since a structure of the 1a scan line GL1a is substantially the same as the structure of the 1b scan line GL1b, a description thereof may be briefly made or may be entirely omitted.

As shown in FIGS. 9 and 10, a light shielding layer GL1b_LS constituting the 1b scan line GL1b is formed on the first substrate 150a. For example, the light shielding layer GL1b_LS may be selected as a multilayer (Mo/Ti/Cu) having a stack structure of molybdenum (Mo), titanium (Ti), and copper (Cu). A buffer layer BUF is formed on the light shielding layer GL1b_LS. For example, the buffer layer BUF may have a structure in which silicon oxide (SiOx) and silicon nitride (SiNx) are alternately stacked.

A semiconductor layer ST_ACT constituting an active layer of the sensing transistor ST is formed on the buffer layer BUF. For example, the semiconductor layer ST_ACT may be formed of an oxide. A first insulating layer GI is formed on the semiconductor layer ST_ACT. The first insulating layer GI may be a gate insulating layer and may be selected as a silicon oxide (SiOx) layer, a silicon nitride (SiNx) layer, or a multilayer thereof.

A gate metal layer ST_GAT constituting a gate electrode of the sensing transistor ST is formed on the first insulating layer GI. For example, the gate metal layer ST_GAT may be formed of one of molybdenum (Mo), aluminum (Al), chromium (Cr), gold (Au), titanium (Ti), nickel (Ni), and copper (Cu), or an alloy thereof. The gate metal layer ST_GAT may have a single-layered structure or a multi-layered structure. The gate metal layer ST_GAT is connected to the light shielding layer GL1b_LS exposed through the first insulating layer GI and the buffer layer BUF. Namely, the light shielding layer GL1b_LS constituting the 1b scan line GL1b and the gate metal layer ST_GAT constituting the gate electrode of the sensing transistor ST are spaced apart from each other in the vertical direction due to the first insulating layer GI and the buffer layer BUF.

A second insulating layer ILD is formed on the gate metal layer ST_GAT. The second insulating layer ILD may be an interlayer dielectric layer and may be selected as a silicon oxide (SiOx) layer, a silicon nitride (SiNx) layer, or a multilayer thereof. A source/drain metal layer VREF_SD constituting a protrusion of the sensing line VREF is formed on the second insulating layer ILD. The source/drain metal layer VREF_SD may be formed of one of molybdenum (Mo), aluminum (Al), chromium (Cr), gold (Au), titanium (Ti), nickel (Ni), and copper (Cu), or an alloy thereof. The source/drain metal layer VREF_SD may have a single-layered structure or a multi-layered structure.

The first embodiment is configured such that the 1a scan line GL1a and the 1b scan line GL1b are respectively positioned in the upper portion and the lower portion of the circuit area DRA and are spaced apart from each other, in order to solve the above-described problems of the experimental example. Hence, the switching transistor SW connected to the 1a scan line GL1a and the sensing transistor ST connected to the 1b scan line GL1b are respectively positioned in the upper portion and the lower portion of the circuit area DRA and are spaced apart from each other.

Further, the first embodiment is configured such that each of the 1a scan line GL1a and the 1b scan line GL1b is formed using not the gate metal layer but the light shielding layer existing in the lowermost layer on the first substrate 150a, in order to solve the above-described problems of the experimental example. The gate electrodes of the switching transistor SW and the sensing transistor ST are formed using a gate metal layer in the same manner as the experimental example and are electrically connected to the light shielding layers constituting the 1a scan line GL1a and the 1b scan line GL1b using the contact hole.

Improvements and effects of the first embodiment in comparison with the experimental example are described below.

As shown in FIG. 11, in the first embodiment, the 1a scan line GL1a and the 1b scan line GL1b are formed using the light shielding layer existing in the lowermost layer on the first substrate 150a, and the 1a scan line GL1a and the 1b scan line GL1b are disposed in the upper portion and the lower portion, respectively, of the circuit area DRA to be spaced apart from each other. As a result, as indicated by "PNT1" of FIG. 11, the number of jumping electrodes can decrease compared to the region "PNT1" of the experimental example.

As the 1a scan line GL1a and the 1b scan line GL1b are formed in the first embodiment using the light shielding layer existing in the lowermost layer on the first substrate 150a, three or more kinds of signal lines and electrodes may be dividedly disposed, in contrast to the experimental example of FIG. 7 in which three or more kinds of signal lines and the electrodes are arranged in the region "PNT2". As a result, the first embodiment can solve the space restriction caused in the experimental example and increase an aperture ratio of the subpixel (i.e., secure the aperture ratio of the subpixel at a predetermined level).

Further, in the first embodiment, an overlap portion may be disposed between the 1a scan line GL1a and the 1b scan line GL1b and the first power line EVDD and the first to fourth data lines DL1 to DL4 in a linear form. Thus, a branch portion is not necessary. As a result, a position of a contact hole CH, in which the sensing line VREF and the sensing connection line VREFC contact each other, does not need to be pulled to the lower portion of the circuit area DRA. Further, because the sensing connection line VREFC can be disposed in a linear form, the aperture ratio of the subpixel can be increased. Namely, the aperture ratio of the subpixel can be increased by increasing a size of the emission area EMA in the subpixel by a reduction in an area of the subpixel occupied by the circuit area DRA.

The first embodiment can reduce an overlap area (generating a parasitic capacitor) between the 1a scan line GL1a and the 1b scan line GL1b and the electrodes adjacent to the 1a scan line GL1a and the 1b scan line GL1b (that overlap each other with the insulating layer interposed therebetween), thereby reducing a line load.

Further, the first embodiment has enough space to perform a repair design of the horizontal direction, thereby securing a repair margin and removing or improving factors (for example, securing the space by removing the branch portion) reducing the aperture ratio of the subpixel as indicated by "PNT2" of FIG. 11.

Because the first embodiment is configured such that the 1a scan line GL1a and the 1b scan line GL1b are formed using the light shielding layer existing in the lowermost layer on the first substrate 150a and are spaced apart from each other, the first embodiment can solve the problems of the experimental example.

Hereinafter, other embodiments which can have effects similar to or the same as the first embodiment will be described. Other embodiments will be described focusing on a 1b scan lines GL1b, which is different from the first embodiment. Therefore, the parts overlapping with the first embodiment will be described with reference to the first embodiment.

Second Embodiment

Figure 12:
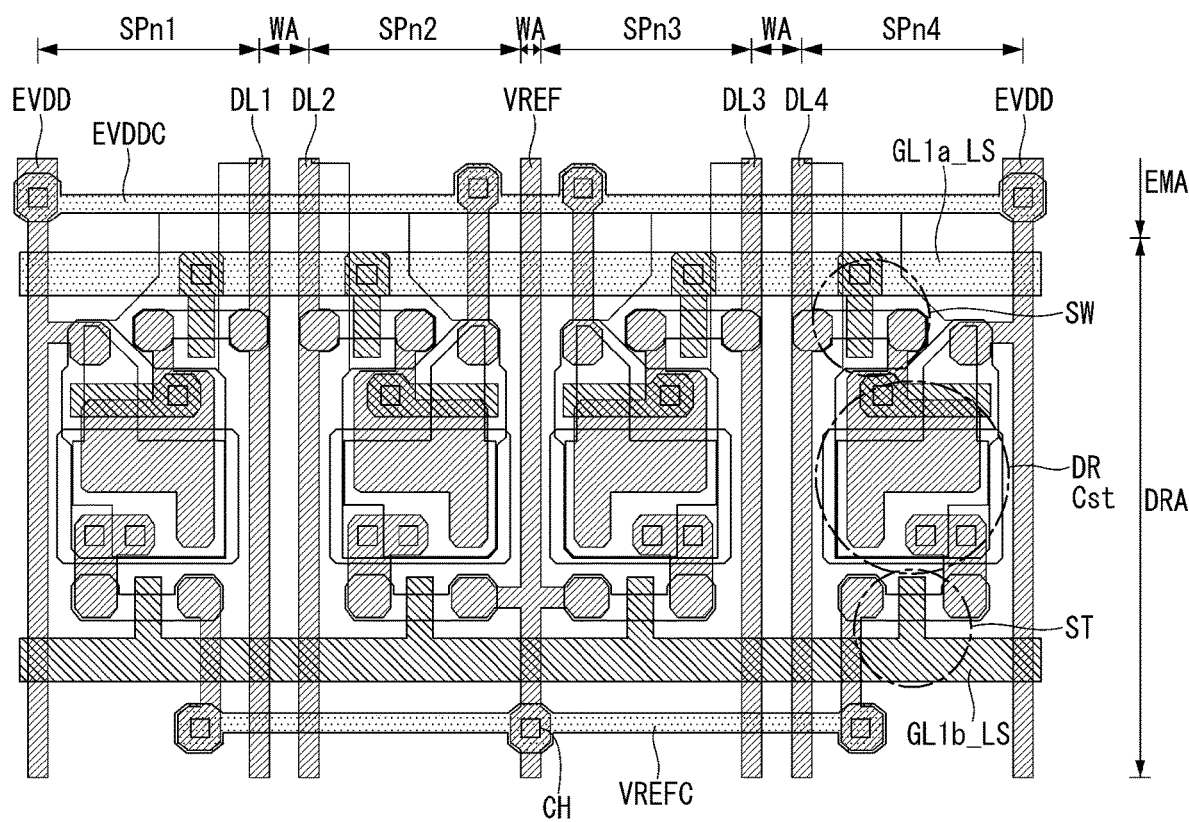
FIG. 12 illustrates in detail a circuit area of FIG. 8 in accordance with a second embodiment.

FIG. 12 illustrates in detail a circuit area of FIG. 8 in accordance with a second embodiment.

As shown in FIGS. 8 and 12, a 1a scan line GL1a and a switching transistor SW are disposed in an upper portion of a circuit area DRA. The upper portion of the circuit area DRA is a portion adjacent to a first power connection line EVDDC that is connected to a first power line EVDD, the first power line EVDD is disposed in a first direction (for example, a vertical direction), and the first power connection line EVDDC is disposed in a second direction (for example, a horizontal direction). A 1b scan line GL1b and a sensing transistor ST are disposed in a lower portion of the circuit area DRA. The lower portion of the circuit area DRA is a portion adjacent to a sensing connection line VREFC that is connected to a sensing line VREF. The sensing line VREF is disposed in the first direction, and the sensing connection line VREFC is disposed in the second direction. A driving transistor DR and a capacitor Cst are disposed in a middle portion of the circuit area DRA. The middle portion of the circuit area DRA is a portion between the upper and lower portions, e.g., between the switching transistor SW and the sensing transistor ST.

The second embodiment is configured such that the 1a scan line GL1a and the 1b scan line GL1b are respectively positioned in the upper portion and the lower portion of the circuit area DRA and are spaced apart from each other, in order to solve the above-described problems of the experimental example. Hence, the switching transistor SW connected to the 1a scan line GL1a and the sensing transistor ST connected to the 1b scan line GL1b are respectively positioned in the upper portion and the lower portion of the circuit area DRA and are spaced apart from each other.

Further, the second embodiment is configured such that the 1a scan line GL1a is formed using not a gate metal layer but a light shielding layer GL1a_LS existing in a lowermost layer on a substrate of a display panel, in order to solve the above-described problems of the experimental example. A gate electrode of the switching transistor SW is formed using a gate metal layer in the same manner as described with respect to the experimental example and is electrically connected to the light shielding layer GL1a_LS constituting the 1a scan line GL1a using a contact hole. The 1b scan line GL1b and a gate electrode of the sensing transistor ST are formed using a gate metal layer GL1b_GAT in the same manner as in the experimental example.

The second embodiment is described such that the 1a scan line GL1a is formed using the light shielding layer, and the 1b scan line GL1b is formed using the gate metal layer, by way of example. However, the embodiment is not limited thereto. For example, the 1a scan line GL1a may be formed using a gate metal layer, and the 1b scan line GL1b may be formed using a light shielding layer.

The display panels have been gradually expanded to high resolution and large-sized display panels. When a line load exists in the switching transistor SW, a problem such as a delay of a scan signal may occur throughout the display panel. This leads to a reduction in display quality of the display panel. On the other hand, because the sensing transistor ST does not greatly affect the supply of a data signal even if the line load exists in the sensing transistor ST, the problem caused by a delay of a sensing signal is relatively less than the delay of the scan signal.

Accordingly, the second embodiment is configured to solve problems that may be caused in high resolution and large-sized display devices. In the second embodiment, it may be preferable, but not required, that the 1a scan line GL1a is formed using the light shielding layer, and the 1b scan line GL1b is formed using the gate metal layer.

Third Embodiment

Figure 13:
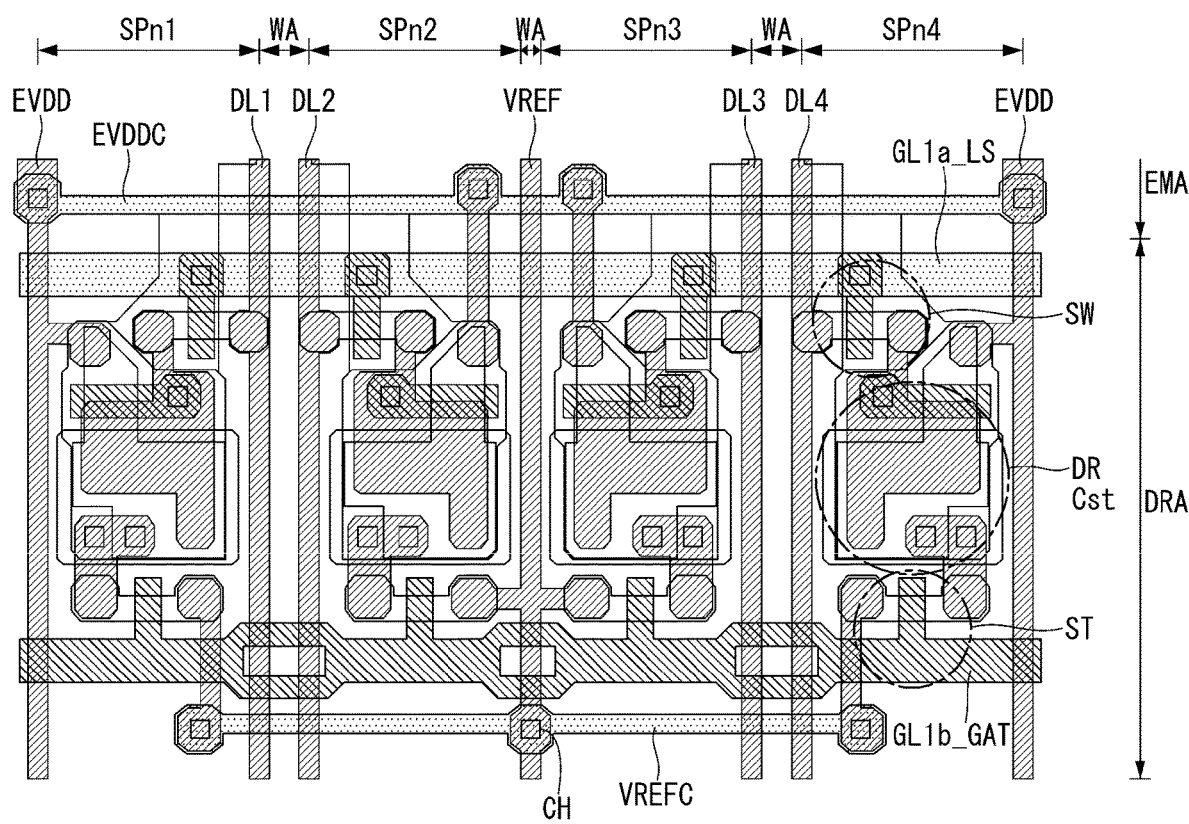
FIG. 13 illustrates in detail a circuit area of FIG. 8 in accordance with a third embodiment.

FIG. 13 illustrates in detail a circuit area of FIG. 8 in accordance with a third embodiment.

As shown in FIGS. 8 and 13, a 1a scan line GL1a and a switching transistor SW are disposed in an upper portion of a circuit area DRA. The upper portion of the circuit area DRA is a portion adjacent to a first power connection line EVDDC that is connected to a first power line EVDD. The first power line EVDD is disposed in a first direction (for example, a vertical direction), and the first power connection line EVDDC is disposed in a second direction (for example, a horizontal direction). A 1b scan line GL1b and a sensing transistor ST are disposed in a lower portion of the circuit area DRA. The lower portion of the circuit area DRA is a portion adjacent to a sensing connection line VREFC that is connected to a sensing line VREF. The sensing line VREF is disposed in the first direction, and the sensing connection line VREFC is disposed in the second direction. A driving transistor DR and a capacitor Cst are disposed in a middle portion of the circuit area DRA. The middle portion of the circuit area DRA is a portion between the upper and lower portions, e.g., between the switching transistor SW and the sensing transistor ST.

The third embodiment is configured such that the 1a scan line GL1a and the 1b scan line GL1b are respectively positioned in the upper portion and the lower portion of the circuit area DRA and are spaced apart from each other, in order to solve the above-described problems of the experimental example. Hence, the switching transistor SW connected to the 1a scan line GL1a and the sensing transistor ST connected to the 1b scan line GL1b are respectively positioned in the upper portion and the lower portion of the circuit area DRA and are spaced apart from each other.

Further, the third embodiment is configured such that the 1a scan line GL1a is formed using not a gate metal layer but a light shielding layer GL1a_LS existing in a lowermost layer on a substrate of a display panel, in order to solve the above-described problems of the experimental example. A gate electrode of the switching transistor SW is formed using a gate metal layer in the same manner as in the experimental example and is electrically connected to the light shielding layer GL1a_LS constituting the 1a scan line GL1a using a contact hole. The 1b scan line GL1b and a gate electrode of the sensing transistor ST are formed using a gate metal layer GL1b_GAT in the same manner as in the experimental example. The 1b scan line GL1b includes a branch portion that is divided into at least two lines, in an overlap portion between the 1b scan line GL1b and the first power line EVDD and the first to fourth data lines DL1 to DL4.

The third embodiment is described such that the 1a scan line GL1a is formed using the light shielding layer, and the 1b scan line GL1b is formed using the gate metal layer, by way of example. However, the embodiment is not limited thereto. For example, the 1a scan line GL1a may be formed using a gate metal layer, and the 1b scan line GL1b may be formed using a light shielding layer.

The display panels have been gradually expanded to high resolution and large-sized display panels. When a line load exists in the switching transistor SW, a problem such as a delay of a scan signal may occur throughout the display panel. This leads to a reduction in display quality of the display panel. On the other hand, because the sensing transistor ST does not greatly affect the supply of a data signal even if the line load exists in the sensing transistor ST, the problem caused by a delay of a sensing signal is relatively less than the delay of the scan signal.

Accordingly, the third embodiment is configured to solve problems that may be caused in high resolution and large-sized display devices. In the third embodiment, it may be preferable, but not required, that the 1a scan line GL1a is formed using the light shielding layer, and the 1b scan line GL1b is formed using the gate metal layer.

As described above, the embodiments of the present disclosure can prevent the damage of the lines and the electrodes resulting from the repair process in manufacturing the display panel including the sensing circuit for sensing the characteristics of the elements, and can secure the aperture ratio of the subpixel while preventing an increase in the line load. Furthermore, the embodiments of the present disclosure can provide a structure of a display panel suitable for manufacturing the high resolution and large-sized display devices.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

Embodiments of the disclosure also include:

(1) A display device including:

subpixels arranged on a substrate, each subpixel including an emission area, in which an emission element is disposed to emit light, and a circuit area, in which a circuit for driving the emission element is disposed; and at least two scan lines positioned in the circuit area, wherein one or more of the at least two scan lines are formed by a metal layer different from a gate metal layer constituting gate electrodes of transistors disposed in the circuit area.

(2) The display device of (1), wherein the at least two scan lines include:

a first scan line connected to a gate electrode of a switching transistor positioned in the circuit area; and a second scan line connected to a gate electrode of a sensing transistor positioned in the circuit area.

(3) The display device of (2), wherein at least one of the first scan line and the second scan line is formed by a metal layer existing in a layer immediately above the substrate.

(4) The display device of (2), wherein the first scan line and the second scan line are formed by the same metal layer as a light shielding layer existing in a layer immediately above the substrate.

(5) The display device of (2), wherein one of the first scan line and the second scan line is formed by a light shielding layer existing in a layer immediately above the substrate, and the other is formed by the gate metal layer.

(6) The display device of (5), wherein the other scan line of the first scan line and the second scan line formed by the gate metal layer includes a branch portion that is branched into at least two lines in an overlap portion between the other scan line and anyone of a power line, a data line, and a sensing line.

(7) The display device of (2), wherein the first scan line is formed by a light shielding layer existing in a layer immediately above the substrate, and
wherein the second scan line is formed by the gate metal layer positioned higher than the light shielding layer.

(8) The display device of (2), wherein the first scan line and the second scan line are disposed to be spaced apart from each other by a driving transistor, which is positioned in the circuit area and provides a driving current for the emission element.

(9) The display device of (2), wherein at least one of the first scan line and the second scan line includes a light shielding layer on the substrate, is insulated from the gate metal layer by a buffer layer on the light shielding layer and a insulating layer on the buffer layer, and is electrically connected to the gate metal layer on the insulating layer by a contact hole on the buffer layer and the insulating layer.

(10) The display device of (1), wherein the at least two scan lines are positioned in opposite portions on the circuit area and are spaced apart from each other.

(11) The display device of (6), wherein the power line, the data line, and the sensing line are disposed in a first direction, and
wherein the first scan line and the second scan line are disposed in a second direction perpendicular to the first direction.

(12) The display device of (6), wherein the first scan line is adjacent to the power line, and
wherein the second scan line is connected to the sensing line and is adjacent to a sensing connection line disposed in a direction perpendicular to the sensing line.

(13) A display device including:
pixels arranged on a substrate, each pixel including an emission area, in which an emission element is disposed to emit light, and a circuit area, in which a circuit for driving the emission element is disposed; and
at least two scan lines positioned in the circuit area,
wherein the at least two scan lines include a first scan line and a second scan line positioned in opposite portions on the circuit area and are spaced apart from each other.

(14) The display device of (13), wherein:
the first scan line is connected to a gate electrode of a switching transistor positioned in the circuit area; and
the second scan line is connected to a gate electrode of a sensing transistor positioned in the circuit area.

(15) The display device of (13), wherein one or more of the at least two scan lines are formed by a metal layer different from a gate metal layer constituting gate electrodes of transistors disposed in the circuit area.

(16) The display device of (13), wherein at least one of the first scan line and the second scan line is formed by a metal layer existing in a layer immediately above the substrate.

(17) The display device of (13), wherein the first scan line and the second scan line are formed by the same metal layer as a light shielding layer existing in a layer immediately above the substrate.

(18) The display device of (13), wherein one of the first scan line and the second scan line is formed by a light shielding layer existing in a layer immediately above the substrate, and the other is formed by the gate metal layer.

(19) The display device of (18), wherein the other scan line of the first scan line and the second scan line formed by the gate metal layer includes a branch portion that is branched into at least two lines in an overlap portion between the other scan line and anyone of a power line, a data line, and a sensing line.

(20) The display device of (14), wherein the first scan line is formed by a light shielding layer existing in a layer immediately above the substrate, and wherein the second scan line is formed by the gate metal layer positioned higher than the light shielding layer.

(21) The display device of (13), wherein the first scan line and the second scan line are disposed to be spaced apart from each other by a driving transistor, which is positioned in the circuit area and provides a driving current for the emission element.

(22) The display device of (13), wherein at least one of the first scan line and the second scan line includes a light shielding layer on the substrate, is insulated from the gate metal layer by a buffer layer on the light shielding layer and a insulating layer on the buffer layer, and is electrically connected to the gate metal layer on the insulating layer by a contact hole on the buffer layer and the insulating layer.

(23) The display device of (19), wherein the power line, the data line, and the sensing line are disposed in a first direction, and
wherein the first scan line and the second scan line are disposed in a second direction perpendicular to the first direction.

(24) The display device of (19), wherein the first scan line is adjacent to the power line, and
wherein the second scan line is connected to the sensing line and is adjacent to a sensing connection line disposed in a direction perpendicular to the sensing line.

The invention claimed is:
1. A display device, comprising:
a plurality of subpixels arranged on a substrate, each subpixel including an emission area, in which an emission element is disposed to emit light, and a circuit area, in which a circuit for driving the emission element is disposed; and
at least two scan lines positioned in the circuit area of each of the plurality of subpixels, the at least two scan lines including:
a first scan line connected to a gate electrode of a switching transistor positioned in the circuit area; and
a second scan line connected to a gate electrode of a sensing transistor positioned in the circuit area,
wherein at least one of the first scan line or the second scan line is formed from a metal layer different from a gate metal layer in which the gate electrodes of the switching transistor and the sensing transistor are formed,
wherein at least one of the first scan line or the second scan line includes a light shielding layer on the substrate,
wherein the light shielding layer directly contacts the gate metal layer of the switching transistor, and the light shielding layer and the gate metal layer are separate, independent components.

2. The display device of claim 1 wherein at least one of the first scan line or the second scan line is formed from a metal layer located in a layer immediately above the substrate.

3. The display device of claim 1 wherein the first scan line and the second scan line are formed from the light shielding layer located in layer immediately above the substrate.

4. The display device of claim 1 wherein one of the first scan line or the second scan line is formed from the light shielding layer located in a layer immediately above the substrate, and the other is formed from the gate metal layer.

5. The display device of claim 4 wherein the other scan line of the first scan line or the second scan line includes a branch portion that is branched into at least two lines in overlap portions between the other scan line and any one of a power line, a data line, or a sensing line.

6. The display device of claim 1 wherein the first scan line is formed from the light shielding layer located in a layer immediately above the substrate, and the second scan line is formed from the gate metal layer, which is positioned higher than the light shielding layer.

7. The display device of claim 1, further comprising:

a driving transistor positioned in the circuit area between the first scan line and the second scan line, the driving transistor configured to provide a driving current for the emission element.

8. The display device of claim 1 wherein at least one of the first scan line or the second scan line is insulated from the gate metal layer by a buffer layer on the light shielding layer and an insulating layer on the buffer layer, and is electrically connected to the gate metal layer on the insulating layer by a contact hole on the buffer layer and the insulating layer.

9. The display device of claim 1 wherein the first scan line and the second scan line are positioned on opposite portions of the circuit area and are spaced apart from each other.

10. The display device of claim 5 wherein the power line, the data line, and the sensing line are disposed in a first direction, and wherein the first scan line and the second scan line are disposed in a second direction that is perpendicular to the first direction.

11. The display device of claim 5 wherein the first scan line is positioned adjacent to the power line, and wherein the second scan line is connected to the sensing line and is adjacent to a sensing connection line disposed in a direction perpendicular to the sensing line.

12. A display device comprising:

a plurality of pixels arranged on a substrate, each pixel including:

an emission element in an emission area, the emission element configured to emit light;

a driving circuit in a circuit area, the driving circuit configured to drive the emission element, the driving circuit including a switching transistor, a sensing transistor, and a driving transistor, the driving transistor electrically coupled to the emission element and configured to provide a driving current to the emission element; and at least two scan lines positioned in the circuit area of each of the plurality of pixels, wherein the at least two scan lines includes a first scan line and a second scan line positioned in opposite portions on the circuit area and are spaced laterally apart from each other and non-overlapping with respect to one another, the driving transistor located between the first scan line and the second scan line, wherein at least one of the first scan line or the second scan line includes a light shielding layer on the substrate, wherein the light shielding layer directly contacts the gate metal layer of the switching transistor, and the light shielding layer and the gate metal layer are separate, independent components.

13. The display device of claim 12, wherein:

the first scan line is connected to a gate electrode of the switching transistor positioned in the circuit area; and the second scan line is connected to a gate electrode of the sensing transistor positioned in the circuit area.

14. The display device of claim 12, wherein one or more of the at least two scan lines are formed by a metal layer different from a gate metal layer constituting gate electrodes of the transistors disposed in the circuit area.

15. The display device of claim 12, wherein at least one of the first scan line or the second scan line is formed by a metal layer located in a layer immediately above the substrate.

16. The display device of claim 12, wherein the first scan line and the second scan line are formed by the same metal layer as the light shielding layer located in a layer immediately above the substrate.

17. The display device of claim 12, wherein one of the first scan line or the second scan line is formed by the light shielding layer located in a layer immediately above the substrate, and the other is formed by the gate metal layer.

18. The display device of claim 17, wherein the other scan line of the first scan line or the second scan line formed by the gate metal layer includes a branch portion that is branched into at least two lines in an overlap portion between the other scan line and any one of a power line, a data line, and a sensing line.

19. The display device of claim 13, wherein the first scan line is formed by the light shielding layer located in a layer immediately above the substrate, and wherein the second scan line is formed by the gate metal layer positioned above the light shielding layer.

20. The display device of claim 12, wherein at least one of the first scan line or the second scan line is insulated from the gate metal layer by a buffer layer on the light shielding layer and an insulating layer on the buffer layer, and is electrically connected to the gate metal layer on the insulating layer by a contact hole on the buffer layer and the insulating layer.

21. The display device of claim 18, wherein the power line, the data line, and the sensing line are disposed in a first direction, and wherein the first scan line and the second scan line are disposed in a second direction perpendicular to the first direction.

22. The display device of claim 18, wherein the first scan line is adjacent to the power line, and wherein the second scan line is connected to the sensing line and is adjacent to a sensing connection line disposed in a direction perpendicular to the sensing line.

* * * * *